US006691055B2

(12) United States Patent
Walter et al.

(10) Patent No.: US 6,691,055 B2
(45) Date of Patent: Feb. 10, 2004

(54) INTEGRATED CIRCUIT PROVIDED WITH MEANS FOR CALIBRATING AN ELECTRONIC MODULE AND METHOD FOR CALIBRATING AN ELECTRONIC MODULE OF AN INTEGRATED CIRCUIT

(75) Inventors: Fabrice Walter, Marin (CH); Christophe Ratajczak, Peseux (CH)

(73) Assignees: EM Microelectronic-Marin SA (CH); Advanced Technology Materials, Inc.

( * ) Notice: Subject to any disclaimer, the term of this patent is extended or adjusted under 35 U.S.C. 154(b) by 6 days.

(21) Appl. No.: 09/742,861

(22) Filed: Dec. 20, 2000

(65) Prior Publication Data

US 2001/0007091 A1 Jul. 5, 2001

(30) Foreign Application Priority Data

Dec. 23, 1999 (EP) ........................................... 99125741

(51) Int. Cl.[7] ............................................... G01R 35/00
(52) U.S. Cl. ....................................... 702/107; 702/106
(58) Field of Search ................................ 702/107, 106, 702/85, 119, 57, 64, 65, 75, 117, 118, 124, 125, 189, FOR 103, FOR 104, FOR 106, FOR 107, FOR 134, FOR 156, FOR 163, FOR 170, FOR 171; 324/601, 763, 537, 765, 758; 714/724, 732; 365/226

(56) References Cited

U.S. PATENT DOCUMENTS 5,070,297 A * 12/1991 Kwon et al. ................ 324/754
5,319,370 A 6/1994 Signore et al. ............. 341/120
5,382,922 A * 1/1995 Gersbach et al. ........... 331/1 A
5,790,469 A 8/1998 Wong ......................... 365/226
5,909,474 A * 6/1999 Yoshizawa .................. 327/156
6,064,947 A * 5/2000 Sun et al. ................... 331/187
6,091,281 A * 7/2000 Yoshida ...................... 327/102
6,151,238 A * 11/2000 Smit et al. ............... 365/225.7
6,157,198 A * 12/2000 Mauerman .................. 324/601

* cited by examiner

*Primary Examiner*—Hal Wachsman
(74) *Attorney, Agent, or Firm*—Richard K Robinson

(57) ABSTRACT

The integrated circuit is provided with integrated calibrating circuit in order to calibrate at least one electronic module supplying at its output a reference voltage or a time base signal or a reference frequency signal. Said calibrating means are defined by a microcontroller which receives via an input pad of the integrated circuit an external reference signal which is compared to an internal reference signal of the reference module in order to be able to calibrate in an autonomous manner the integrated reference electronic module as a function of the external reference signal. The final calibrating parameters are permanently stored with an associated signature in a memory so that each time that voltage is subsequently applied to the circuit the final calibrating parameters are automatically applied to the corresponding reference module.

14 Claims, 4 Drawing Sheets

INTEGRATED CIRCUIT PROVIDED WITH MEANS FOR CALIBRATING AN ELECTRONIC MODULE AND METHOD FOR CALIBRATING AN ELECTRONIC MODULE OF AN INTEGRATED CIRCUIT

BACKGROUND OF THE INVENTION

The present invention concerns an integrated circuit provided with means for calibrating at least one electronic module, a method for calibrating at least one electronic module of such integrated circuits in test phase, and a wafer of integrated circuits provided with calibrating means.

After having passed through the manufacturing steps, the integrated circuits on wafers or semiconductor substrates are tested together with the aid of a probe card test apparatus. Several batches of wafers are, for example, set on standby in the programmed apparatus before the wafers are gripped and each placed on a test support in order to receive the test probes on the corresponding pads of the integrated circuits to be tested. Usually, circuits on the wafer or the substrate are tested one after the other by means of a probe card placed on the contact pads of one of the circuits to be tested.

Currently, calibration is effected individually for each integrated circuit in order to obtain precise reference values by acting on internal or external electronic elements. In such case, the use of multiple probe cards for the simultaneous testing of several integrated circuits is thus not possible. This extends the testing time of the integrated circuits and causes an increase in additional costs in the manufacturing chain.

U.S. Pat. No. 5,648,661 discloses such an arrangement of metal paths in sawing strips to facilitate the testing of several integrated circuits on a same substrate or wafer without requiring the use of complicated probe cards, which allows a saving in the testing time. The metal paths disappear after the wafer is sawed to separate each integrated circuit. It is to be noted that no means for calibrating the electronic modules of integrated circuits are provided and that making the metal paths normally requires an additional step in the manufacturing of the integrated circuits, which is a drawback.

SUMMARY OF THE INVENTION

One object which the subject of the invention proposes to resolve includes an integrated circuit provided with means for calibrating at least one reference electronic module so that the output signal of the module is calibrated precisely to overcome the drawbacks described above.

Another object which the subject of the invention proposes to resolve includes a method for calibrating in test phase at least one electronic module of integrated circuits so that the output signal of the module is calibrated precisely in order to overcome the drawbacks described above.

These objects, in addition to others are achieved as a result of the integrated circuit provided with means for calibrating at least one electronic module, which is characterised in that the calibrating means are provided to calibrate in an autonomous manner at least one integrated reference electronic module as a function of an external reference signal introduced into the circuit by an input pad of the circuit and to store the final calibrating parameters when the output signal of the reference module is equal to the external reference signal.

These objects, in addition to others are also achieved as a result of the method for calibrating in test phase at least one integrated reference electronic module of at least one integrated circuit, which is characterised in that it includes the steps of:

a) powering the integrated circuit via an external electric power source;

b) applying on one of the input pads of the integrated circuit an eternal reference signal in conjunction with calibrating means of the integrated circuit so that they calibrate autonomously by iterating the reference electronic module using calibrating parameters until the reference output signal of the reference module is equal to the external reference signal; and c) storing the final calibrating parameters provided by the calibrating means and a signature associated with the parameters in memory means.

These objects, in addition to others, are also achieved as a result of a wafer of integrated circuits which is characterised in that the integrated circuits are arranged on the wafer as a function of the location of their signal input and output pads in order to allow the probes of a probe card of a test machine to be placed on the pads of a group of integrated circuits to test and calibrate all the circuits of the group at the same time.

One advantage of the integrated circuit is that it is capable of calibrating in an autonomous manner; an internal reference signal of an integrated reference module, such as a reference voltage; and a time base or a reference frequency, on the basis of an external reference signal which is imposed and desired. As soon as the calibration phase is completed, a specific calibration word, forming the final calibrating parameters, is stored in an internal memory, for example an EEPROM memory, as well as the associated signature.

This final calibration storing prevents it being necessary, each time that voltage is subsequently applied to the circuit, to undertake a new calibrating operation, and prevents another external reference signal allowing another undesired calibration of the reference modules. For this purpose, as soon as voltage is applied to the integrated circuit, a check is thus made to see whether there is a signature stored in the memory, if so, no calibration method is started, since the calibration word of the memory is directly applied to the reference module.

For the sake of safety, it may be envisaged to have no signal input or output pad on the circuit directly connecting the output of the reference electronic module or modules in order to avoid anyone being able to have easy access to these parts of the circuit. The only accessible input pad for acting on the reference modules remains that which is used for calibrating the corresponding module. This calibrating pad should normally not allow the reference module to be acted on once the calibrating operation has finished.

Another advantage consists in that groups of integrated circuits of a same wafer can be calibrated in succession in an autonomous manner using an external reference signal applied at the same time to a group of circuits in test phase. Of course, other tests on the circuits can be undertaken in addition to the steps for calibrating the reference modules in a grouped or individual manner. In order to do this, a probe card placed on a group of neighbouring integrated circuits allows each circuit of the group to be supplied with electric voltage and, in a single operation, the reference signal to be brought at the corresponding input pad of each circuit so that it can be calibrated autonomously.

Since several circuits are calibrated at the same time and not successively, this allows the testing and calibrating time of the reference electronic modules to be reduced, as well as the costs in the manufacturing chain without it being necessary to provide the test apparatus with a specific complicated structure.

In a single operation, all the integrated circuits connected to a same external reference signal are calibrated quickly and autonomously of iterations by introducing into their EEPROM memory the calibrating word with the corresponding signature at the end of calibration of the reference module. This way of calibrating integrated reference modules of the circuit during testing can easily be repeated on another group of integrated circuits.

BRIEF DESCRIPTION OF THE FIGURES

The objects, advantages and features of the integrated circuit and the calibration method will appear more clearly in the following description of embodiments illustrated by the drawings in which.

DETAILS DESCRIPTION OF THE EMBODIMENT

The following description will not describe all the components or electronic units which the integrated circuits include, except those allowing the reference electronic modules to be calibrated autonomously. It is clear that the calibrating means are an additional part of the circuit, which results in a loss of space, but which is largely compensated for by the advantage or facility of calibrating the integrated reference modules autonomously.

The reference modules are for example a reference voltage module for powering most of the electronic components of an analogue and/or digital part of the circuit at a certain voltage which may be of the order of 2 volts for example, an oscillator module being used to provide a reference frequency or also a time base for the synchronisation of different electronic units of the circuit. Since the integrated circuits can also include reference modules providing a reference voltage or a reference frequency signal, the calibrating means of the circuit are arranged to calibrate automatically one or other reference module. This calibration is normally performed successively, but it could also occur in parallel.

Integrated circuits are usually made on silicon wafers. After the manufacturing steps of the integrated circuits, it is necessary to make them undergo a functionality test of the internal electric connections, its components or electronic units. In order to do this, the wafers are brought into a test apparatus in batches, so that each wafer can be automatically gripped and placed on a test support. The probes of a probe card are placed on the metal signal input or output pads of each integrated circuit in order to test them.

During this test phase, the invention proposes to calibrate certain reference modules which each integrated circuit includes. This calibration will be achieved autonomously by the integrated circuit or circuits supplied with electric voltage by supplying them with an external reference signal at the same time.

Figure 1:
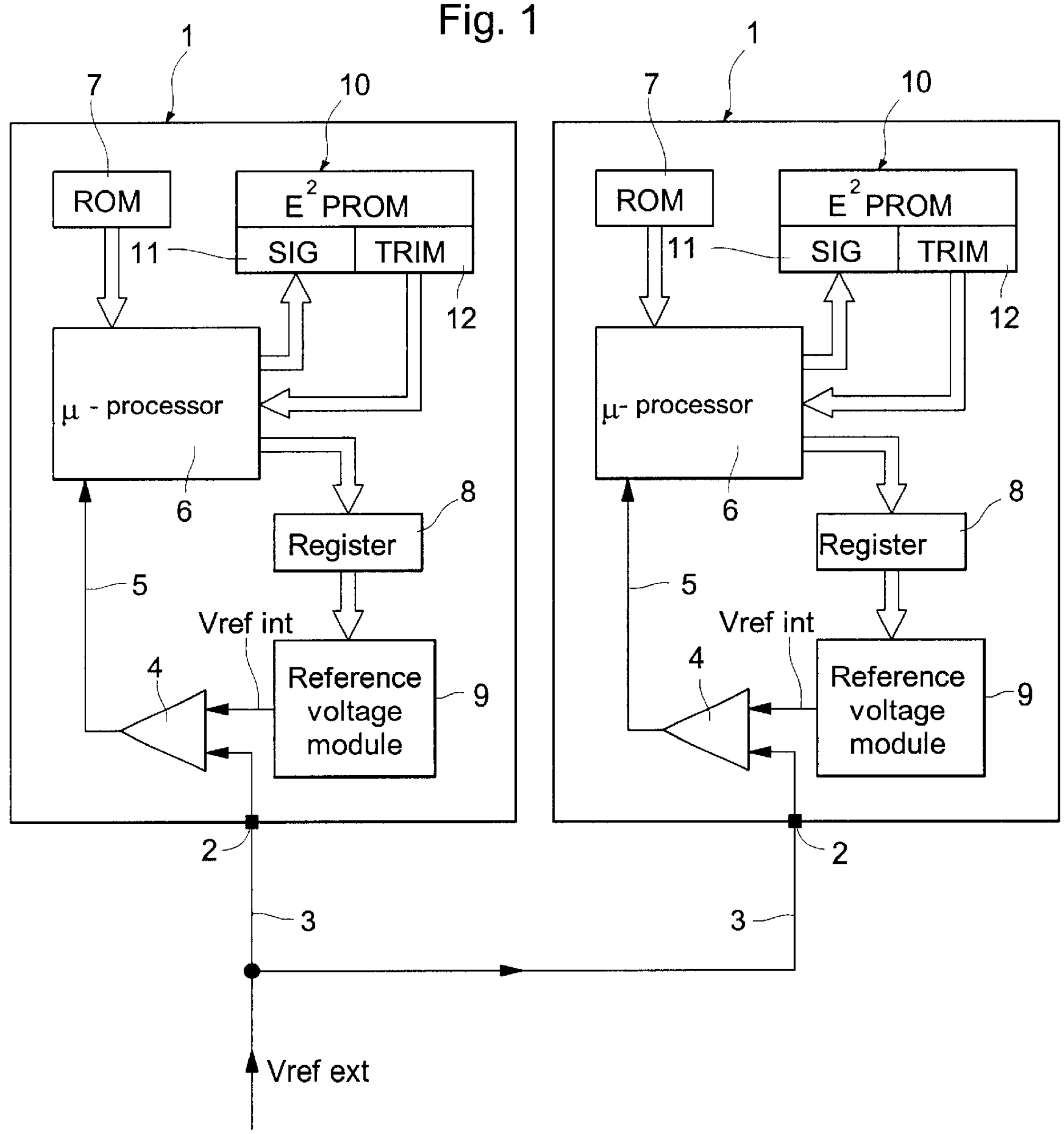
FIG. 1 shows schematically two integrated circuits where a reference voltage is applied at the same time to both circuits to automatically calibrate their reference voltage module.
Figure 2:
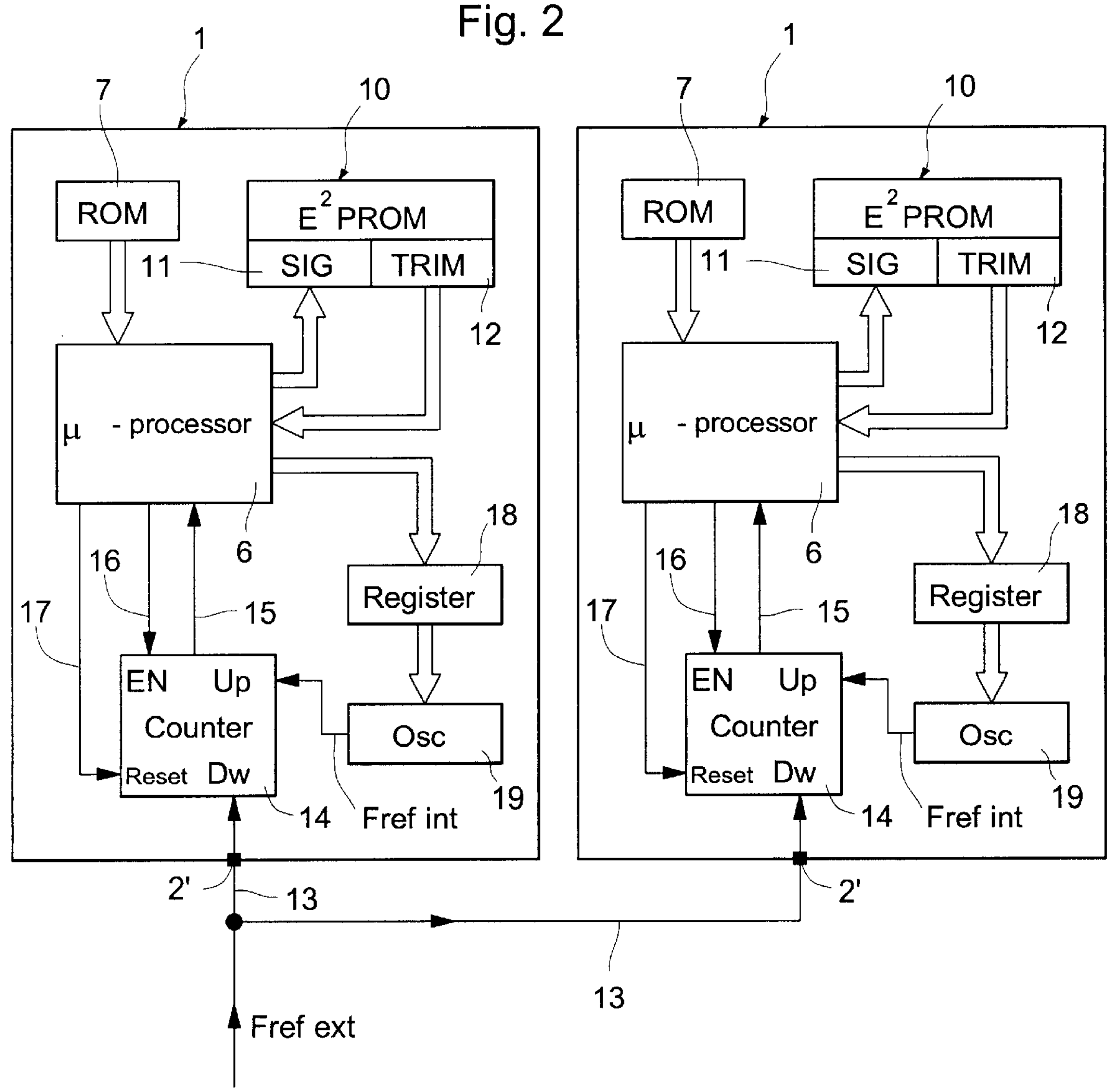
FIG. 2 shows schematically two integrated circuits where a reference frequency is applied at the same time to both circuits to automatically calibrate their reference oscillator module.

Even if two integrated circuits each receiving at the same time an external reference signal at an input pad 2 or 2' are shown schematically in FIGS. 1 and 2 by simplification, the design of the integrated circuits is such that it allows several integrated circuits to be connected at the same time so that they are autonomously calibrated.

The connection of several circuits on a common substrate is achieved by using a multiple probe card during the test phase. In these conditions, during manufacturing of the circuits, the location of the signal input and output pads is of primordial importance to allow the probes of such a probe card to be placed on pads of several circuits. Calibration of the integrated circuits thus occurs during testing of the circuits, since this will facilitate all the testing and calibrating operations of the wafers.

In FIG. 1, reference signal 3, in this first embodiment, is a reference voltage Vref ext, but of course, it could be a time base signal or a reference frequency signal which will be explained with reference to FIG. 2. This external reference voltage 3 is connected to the two input signal pads 2 of each circuit 1.

Integrated circuits 1 of the first embodiment include means for calibrating at least one integrated reference module, i.e. reference voltage module 9. The calibrating means are formed by a microcontroller well known to those skilled in the art. This reference voltage module 9 allows most of the electronic components of the circuit, which have not been illustrated for the sake of simplification, to be supplied with a regulated low voltage.

At the end of the manufacturing process, the electric parameters of each part of the integrated circuits are in a variation margin due to the method and are thus not precisely defined. The calibrating means allow this variation in electric parameters to be eliminated by calibrating each reference module based on an external reference signal.

The calibrating means of integrated circuits 1, i.e. the microcontroller, include comparing means such as a comparator 4 in this embodiment receiving at its inputs the external reference voltage Vref brought at input pad 2 and the reference voltage Vref int provided by reference voltage module 9. The output 5 of comparator 4 provides a control signal to a microprocessor 6 which controls the entire calibrating procedure of reference voltage module 9. A ROM memory 7 contains a known calibrating parameter calculating algorithm and being connected to microprocessor 6 allowing it to calculate calibrating parameters to be imposed on reference voltage module 9 as a function of the result of the comparison of comparator 4. An EEPROM memory 10 connected to microprocessor 6 and intended to store the final calibrating parameters 12 with an associated signature 12. The calibrating parameters calculated by microprocessor 6 using the appropriate algorithm stored in ROM memory 7 are transmitted into a calibrating register 8 disposed as an interface before reference voltage module 9. The calibrating parameters or the calibrating word we addressed in parallel in the register.

The calibrating operation is undertaken by iteration until reference voltage module 9 supplies at output a reference voltage Vref int which is equal to the desired external reference voltage Vref ext. The calculating algorithm which is known to those skilled in the art may be an linear approach algorithm or a successive approximation algorithm, for example by dichotomy.

From the moment when internal reference voltage Vref int of reference voltage module 9 is equal to external reference voltage Vref ext, the output 5 of the comparator 4 provides an item of data to microprocessor 6 indicating to the microprocessor that calibrating has finished. The final calibrating parameters, i.e. the calibrating word, are introduced by microprocessor 6 normally in a permanent manner, into a portion 12 of EEPROM memory 10 with an associated signature 11 which specifies to the circuit that the calibrating operation of the corresponding reference module has been performed. In the drawings, TRIM designates a calibrating word or calibrating parameters of a reference module, and SIG designates the signature associated with the calibrating parameters of the module.

The calibration of reference voltage module 9 can be achieved for example by modifying resistance values of a network of resistors placed in series or in parallel acting on the value of the reference voltage at the output of the module. Another way of calibrating this reference voltage consists in addressing a binary word to a series of switches wherein the opening and closing of each switch is controlled by a bit of the binary word, each switch connecting a resistor to a specific current source. This calibrating operation also called trimming, will not be described further, since it forms part of the knowledge of those skilled in the art of this field of electronic.

Once the testing of all the integrated circuits on the wafers, and the calibrating of all their reference modules is finished, the integrated circuits are separated from each other by sawing the wafers. The circuits, are subsequently mourned on hybrid assemblies or are encapsulated.

Given that EEPROM memory 10 has permanently stored the final calibrating parameters with the associated signature, any subsequent powering of the integrated circuit no longer involves calibrating the reference modules by checking the signature stored in said memory 10. Each time that voltage is applied to the circuit, EEPROM memory 10 provides the final calibrating parameters to register 8 via microprocessor 6, so that reference voltage module 9 generates a calibrated reference voltage.

FIG. 2 shows a second embodiment for calibrating two integrated circuits 1 supplied in parallel by an electric voltage source and a same reference signal 13 applied to input pads 2' of each circuit. Microprocessor 6, ROM memory 7 and EEPROM memory 10 are equivalent to the first embodiment and will not be described in such a detailed way. As for the first embodiment with reference to FIG. 1, only two integrated circuits 1 are shown, but it is clear that several circuits could be connected in parallel with a same reference signal 13 applied at their input pad 2' so that they are calibrated autonomously.

In this second embodiment, the reference module to be calibrated is an oscillator 19 which supplies at output a reference frequency signal Fref int used in particular for synchronising different electronic components or logic blocks of the circuit. This reference frequency signal Fref int can be introduced into dividers to define time bases, in particular in the case in which the integrated circuit is used in the horological field.

The external reference frequency signal Fref ext received at the input pads 2' is brought to one of the inputs of a counter 14 the other input of which receives the internal frequency signal Fref int of oscillator module 19. Counter 14 is initially reset to zero by an erasing signal 17 provided by microprocessor 6. A read window for the two reference frequency signals is imposed by the microprocessor which provides a read signal 16 to counter 14. The result of the counter of the difference between the two frequencies is a data signal 15 for the microprocessor so that it can calculate calibrating parameters with the algorithm of memory 7. The calibrating parameters, which are binary words for example, are transmitted into a register 18 placed at the input of oscillator 19.

This calibrating operation continues by iteration until the two reference frequencies are equal. From that moment, the final calibrating parameters of the oscillator are introduced by microprocessor 6 normally permanently into a portion 12 of EEPROM memory 10 with an associated signature 11 which specifies to the circuit that the calibrating operation has been performed.

In the event that the integrated circuits also include both a reference voltage module and an oscillator, the calibration of each of these modules is normally performed in a successive manner. The final calibrating parameters of each of these reference modules with the associated signature are placed in different portions of the EEPROM memory.

Figure 3:
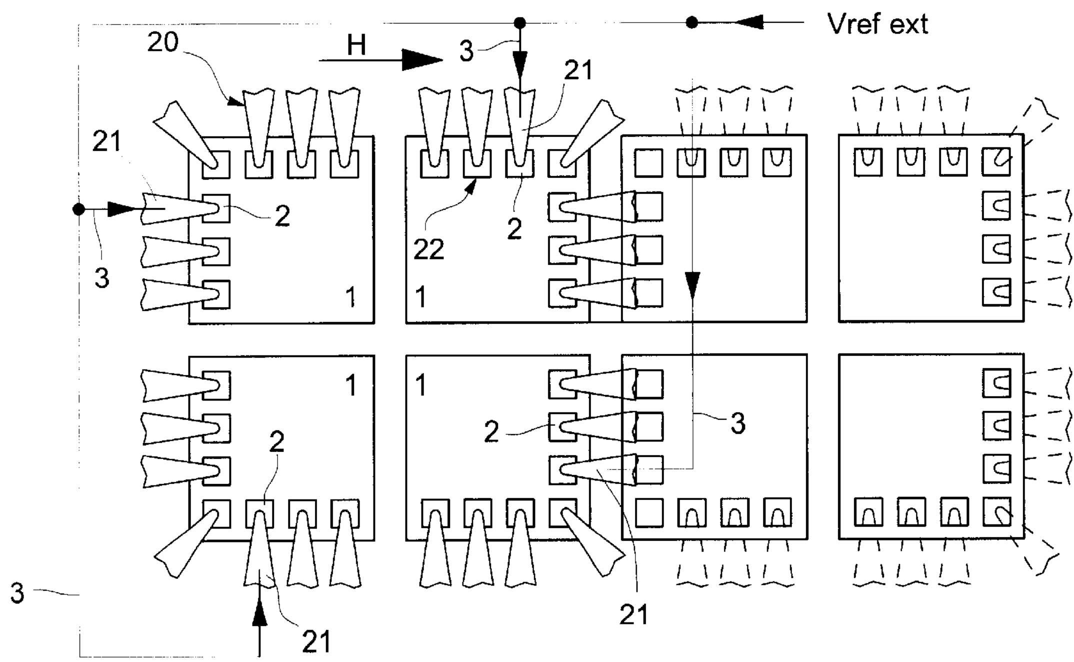
FIG. 3 shows a portion of the integrated circuits on a same substrate each rotated by 90° with respect to their immediate neighbour so that a probe card can be placed on the contact pads of four circuits in order for them to be tested and calibrated at the same time.
Figure 4:
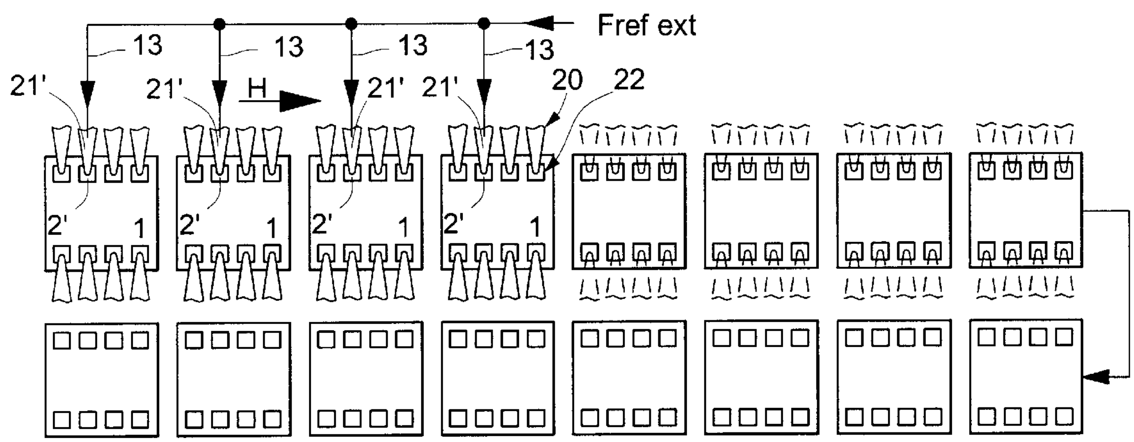
FIG. 4 shows a portion of the integrated circuits on a same substrate, to be tested and calibrated at the same time with a card being placed on the contact pads of four circuits disposed in a line.

FIGS. 3 and 4 are a diagram of the way in which several integrated circuits 1 in parallel are tested and calibrated using a multiple probe card. The probes 20 of the probe card are placed on the signal input and output pads 22 of four integrated circuits 1. Of course, more than four integrated circuits 1 could be connected in parallel according to the location of their signal input and output pads 22. The electric voltage source for supplying the integrated circuits is connected to two of the pads 22, but it is not illustrated to avoid overloading the FIGURES. This multiple integrated circuit connection allows the integrated circuits in parallel to calibrate their reference modules autonomously, but also to be able to group certain operational test in order to save testing time.

In FIG. 3, probes 20 of a multiple probe card are placed on pads 22 of four integrated circuits 1 of which two circuits are disposed above two other circuits. In this configuration, pads 22 of each circuit have to be arranged in such a way that probes 20 of the probe card can easily be placed on the pads 22. For this reason, as shown, each integrated circuit has pads 22 rotated by ±90° wit respect to its immediate neighbor. The integrated circuit disposed above and to the right has pads 22 rotated by +90° with respect to the integrated circuit disposed above and to the left while the integrated circuit disposed below and to the left has pads 22 rotated by −90° with respect to the circuit disposed above and to the left. This set of four integrated circuits thus has all the pads 22 disposed at the periphery of the set in order to facilitate the making of a standard probe card connecting four integrated circuits for a multiple test and multiple calibration. For each integrated circuit, a probe 21 of the probe card is placed in particular on the input pad 2 or 2' described hereinbefore. Each probe of the probe card bends when in contact with a corresponding pad of one of the circuits. The probes must therefore not overlap when the cards are made to avoid short-circuiting them.

It is to be noted that in order to obtain this off-setting of pads 22, it is also necessary, when the integrated circuits are made on a silicon wafer, for the masks of each step of the manufacturing process also to be provided so that each integrated circuit of a group of four integrated circuits is rotated by ±90° with respect to its immediate neighbour. Of course, in such an embodiment, it is preferable for the shape of each circuit to be square to avoid wasting space on the wafer.

The external reference signal 3 in this FIG. 3 represents the external reference voltage Vref ext which is applied by probes 21 at input pads 2. The external reference frequency signal applied at another input pad of each circuit could also have been shown if it were necessary to calibrate the reference voltage module and the oscillator module.

Once the four integrated circuits of the semiconductor substrate have been tested and calibrated, probes 20 of the probe card are raised and moved in the direction H to be placed on four other integrated circuits to be tested and calibrated. The location of the probes on the four other circuits is shown in dotted lines.

In FIG. 4, probes 20 of a multiple probe card are placed on the pads 22 of four integrated circuits 1 disposed in a line. Each integrated circuit has all the input and output pads 22 disposed along two opposite edges. In this configuration, the making of a probe card intended to connect at least four integrated circuits is facilitated. Even though only four integrated circuits to be tested and calibrated in parallel are shown in FIG. 4, it is clear that the design of a probe card which is placed for example on 8 integrated circuits disposed in a line would not pose any real additional difficulties with the possible exception of the alignment of the probes to be placed on a larger number of pads.

In this FIG. 4, only the external reference frequency signal 3 is shown connected to probes 21' of the probe card connecting pads 2', but as previously, an external reference voltage signal 3 could also be applied to another input pad of each circuit for the case in which the oscillator module and the reference voltage module have to be calibrated.

Once the testing and calibrating operation is finished for the four integrated circuits, probes 20 of the probe card are raised and moved in direction H to be placed on four other integrated circuits to be tested and calibrated, as explained hereinbefore. The location of probes 20 in this other position is shown in dotted lines.

Figure 5:
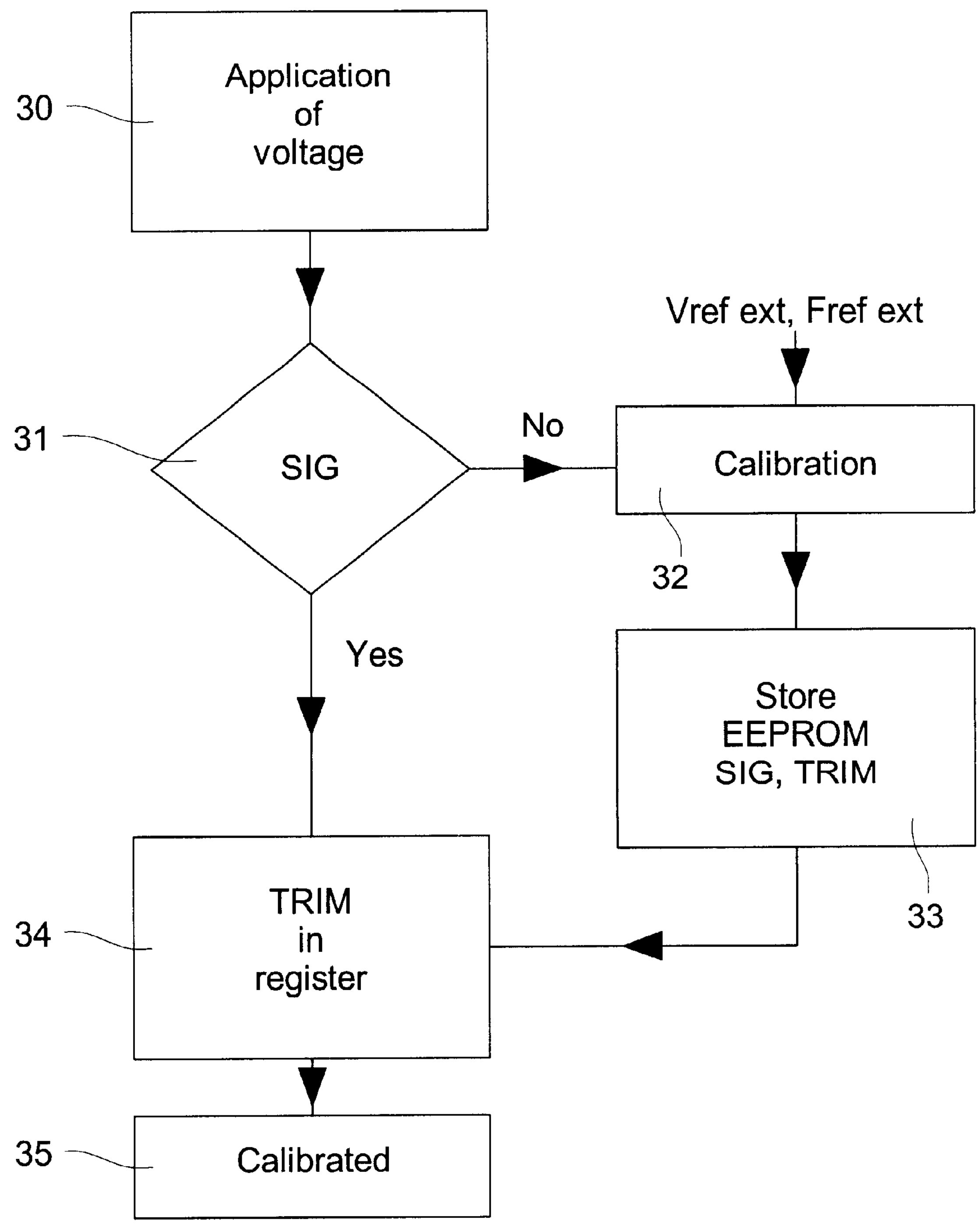
FIG. 5 shows a flow chart of the procedure of the checking and calibrating operations when voltage is applied to the integrated circuit.

As soon as voltage and an external reference signal is applied thereto, the integrated circuit will check whether it has to calibrate itself or whether, conversely, this operation has already been performed. FIG. 5 illustrates the checking and calibrating procedure of the integrated circuits.

First of all, voltage 30 is applied to the integrated circuit whether it is for a circuit in test phase from a wafer of circuits or for a circuit separated from the wafer. For this purpose, a power source is connected across two metal pads of the integrated circuit. As soon as voltage is applied, a check is effected to find out whether a calibrating operation has already been performed on the reference modules. An EEPROM memory includes the stored calibrating word or words and a signature associated with each calibrating word of a corresponding reference module.

In the event that there is no signature 31 stored in said memory, corresponding to the calibrating words, a calibrating operation 32 can occur. At least one external reference signal, for example Vref ext and/or Fref ext, is introduced by a metal input pad of the circuit so that the calibration of the reference module or module can take place. As soon as calibration is finished, the final calibrating parameters, i.e. the calibrating word, are stored in the EEPROM memory 33 with the associated signature. Each calibrating word with its signature corresponds to the calibrating parameters of one of the reference modules. Finally, the final calibrating parameters are placed in register 34 so that the reference module is calibrated 35.

However, if, after application of voltage 30, a signature is already stored in the EEPROM memory, the latter will, thanks to the microprocessor, transmit the calibrating parameters (calibrating word) to register 34 of the reference module so that it is calibrated 35.

Normally, storage of the final calibrating parameters in the memory for me corresponding reference module is permanent, which means that even if a different reference signal to that initially desired is applied, there will be no other calibrating operation, since when voltage is applied to the circuit it will find the signature of the parameters in the EEPROM memory.

It should be noted that even though the preceding description was made with permanent storage of the final calibrating parameters with the associated signature, this does not however exclude the possibility of being able to calibrate circuits on a wafer or circuits which have already been isolated by sawing said wafer. This subsequent operation provides the possibility of being able to overcome certain electric parameter drifts due for example to the circuits ageing or to the effects of temperature. In this sense, the circuits thus undergo re-calibration of their reference modules.

From the description which has just been made, multiple variants can be designed by those skilled in the art without departing from the scope of the invention. For example, instead of using probe cards for testing and calibrating several circuits in parallel, it could have been envisaged to connect the integrated circuits of the wafer by metal paths passing through sawing strips which are destroyed by the sawing operation. Two metal paths bring the supply voltage of each circuit, while one or two metal paths are intended to bring one or two reference signals for calibrating one or two reference modules of each integrated circuit.

What is claimed is:

1. An integrated circuit including at least one electronic module comprising:

an input for introducing into the integrated circuit an external reference signal;

a calibrating means for calibrating the at least one electronic module, wherein said calibrating means includes means to calibrate in an autonomous maimer the at least one electronic module as a function of the external reference signal introduced into the integrated circuit via the input to obtain final calibrating parameters when an output signal of the electronic module is equal to the external reference signal;

a storage means for storing the final calibrating parameters, the stored calibrating parameters having an associated signature stored therewith; and a signature detection means for detecting the associated signature presence in the storage means such that when a signal is applied to the input, the presence of said associated signature allows the stored calibrating parameters to be transmitted to the at least one electronic module.

2. The integrated circuit according to claim 1, wherein the calibrating means includes:

a comparing means for comparing the output signal of the at least one electronic module to the external reference signal, and to provide at its output a comparison signal;

a microprocessor for controlling the calibration of said at least one electronic module as a function of the comparison signal received from the comparing means;

a first storage having stored therein a calculating algorithm, the first storage being operatively connected to the microprocessor to allow it to calculate calibrating parameters as a function of the comparison signal using the calculating algorithm; and a second storage connected to the microprocessor for storing the final calibrating parameters of said electronic module as well as the associated signature.

3. The integrated circuit according to claim 2, wherein the at least one electronic module supplies at its output a reference voltage, and wherein the comparing means includes:

a comparator having first and second inputs, the first input receives the reference voltage from the at least one electronic module to be calibrated, and the second input receives an external reference voltage.

4. The integrated circuit according to claim 2, wherein the at least one electronic module is an oscillator supplying at its output a reference frequency signal, and wherein the comparing means includes a counter having first and second inputs, the first input receives the reference frequency signal from the oscillator, and the second input receives an external reference frequency signal.

5. The integrated circuit according to claim 2, wherein the first storage is a ROM memory, and the second storage is an EEPROM memory, and the input includes a data register as an interface at the input of the at least one electronic module to receive the calibrating parameters.

6. The integrated circuit according to claim 1, wherein the at least one electronic module includes:

a first reference module supplying at its output a reference voltage; and a second reference module supplying at its output a reference frequency signal, wherein said integrated circuit receives at a first input pad an external reference voltage for calibrating the first reference module, and at a second input pad an external reference frequency signal for calibrating the second reference module.

7. The integrated circuit according to claim 1, wherein the external reference signal is an external time base signal.

8. The integrated circuit according to claim 1, further including a plurality of integrated circuits being disposed on a wafer in groups of neighboring and similar circuits, the neighboring and similar integrated circuits being oriented differently so that the location of the input and output pads allow probes of a probe card of a test machine to be placed on the pads of a group of the neighboring and similar integrated circuits in order to test and calibrate all the circuits of the group at the same time.

9. The integrated circuit according to claim 8, wherein the group of integrated circuits includes four neighboring integrated circuits, wherein the circuits are disposed on two parallel lines so as to form a substantially square group, each circuit being rotated with respect to its immediate neighbor by ±90° so that all the pads are located at the periphery of the group.

10. A method for calibrating in test phase at least one reference module of at least one integrated circuit, wherein the method includes the steps of:

a) powering the integrated circuit via an external electric power source;

b) applying to an input pad of the integrated circuit an external reference signal;

c) autonomously calibrating the at least one reference module using calibrating parameters to obtain final calibration parameters when a reference output signal of the at least one reference module is equal to the external reference signal;

d) storing the final calibrating parameters and an associated signature associated with said final calibrating parameters in memory; and e) detecting, when a voltage is applied to the integrated circuit, the presence of said associated signature stored in the memory and transmitting the stored calibrating parameters to said at least one reference module when the stored associated signature is detected.

11. The method according to claim 10, wherein the step of autonomously calibrating comprises:

comparing the external reference signal with the output signal of the at least one reference module to obtained a compared signal;

calculating the calibrating parameters with a microprocessor as a function of the compared signal and a calculating algorithm, the calibrating parameters being applied to the reference module to modify the reference output signal, and repeating the preceding operations until the reference output signal of the at least one reference module is equal to the external reference signal.

12. The calibrating method according to claim 10, further comprising step of autonomously calibrating each circuit of a plurality of integrated circuits on a same semiconductor substrate at the same time using a same external reference signal applied to the input pad of each circuit.

13. The calibrating method according to claim 12, further comprises the step of placing probes of a multiple probe card of a test machine on the input and an output pads of each of multiple neighboring integrated circuits of the plurality of integrated circuits, so that all integrated circuits of the plurality of intended circuits are calibrated autonomously at the same time.

14. The calibration method according to claim 10, wherein at least one reference module supplies at its output a reference voltage and the integrated circuit further includes a second reference module supplying at its output a reference frequency signal, wherein the method further comprises the step of receiving at a first input pad an external reference voltage for calibrating the at least one reference module and at a second input pad an external reference frequency signal for calibrating the second reference module.

* * * * *

UNITED STATES PATENT AND TRADEMARK OFFICE

CERTIFICATE OF CORRECTION

PATENT NO. : 6,691,055 B2
DATED : February 10, 2004
INVENTOR(S) : Fabrice Walter It is certified that error appears in the above-identified patent and that said Letters Patent is hereby corrected as shown below:

Column 8,
Line 45, "autonomous maimer" should read -- autonomous manner --.

Signed and Sealed this

Eighteenth Day of May, 2004

JON W. DUDAS
*Acting Director of the United States Patent and Trademark Office*